United States Patent
Quiquempoix et al.

(10) Patent No.: US 6,909,388 B1
(45) Date of Patent: Jun. 21, 2005

(54) FRACTAL SEQUENCING SCHEMES FOR OFFSET CANCELLATION IN SAMPLED DATA ACQUISITION SYSTEMS

(75) Inventors: Vincent Quiquempoix, Divonne les Bains (FR); Philippe Deval, Lutry (CH)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 10/874,606

(22) Filed: Jun. 23, 2004

(51) Int. Cl.⁷ .............................................. H03M 3/00
(52) U.S. Cl. ...................... 341/143; 341/155; 341/120
(58) Field of Search ................................ 341/143, 155, 341/120, 119, 118

(56) References Cited

U.S. PATENT DOCUMENTS

| | | | |
|---|---|---|---|
| 4,939,516 A | | 7/1990 | Early ......................... 341/143 |
| 5,055,843 A | * | 10/1991 | Ferguson et al. ........... 341/143 |
| 5,241,702 A | | 8/1993 | Dent ......................... 455/278.1 |
| 5,345,236 A | * | 9/1994 | Sramek, Jr. ............... 341/144 |
| 5,459,432 A | | 10/1995 | White et al. ................ 329/307 |
| 5,949,361 A | * | 9/1999 | Fischer et al. .............. 341/143 |
| 6,052,422 A | | 4/2000 | Lin ............................ 375/355 |
| 6,208,279 B1 | * | 3/2001 | Oprescu .................... 341/143 |
| 6,259,389 B1 | | 7/2001 | McGrath .................... 341/120 |
| 6,285,311 B1 | * | 9/2001 | Lewicki ..................... 341/172 |
| 6,316,992 B1 | | 11/2001 | Miao et al. .................. 330/2 |
| 6,653,960 B2 | * | 11/2003 | Mitamura et al. .......... 341/143 |
| 6,765,517 B1 | * | 7/2004 | Ali ............................ 341/143 |

FOREIGN PATENT DOCUMENTS

| | | | |
|---|---|---|---|
| WO | 9528766 | 10/1995 | ............ H03D/1/04 |
| WO | 9813968 | 4/1998 | ............ H04L/7/02 |

* cited by examiner

Primary Examiner—Jean Bruner Jeanglaude
(74) Attorney, Agent, or Firm—Baker Botts L.L.P.

(57) ABSTRACT

The present invention is directed to the isolation and cancellation of the offset voltage component typically experienced at the input of sampled-data analog systems. In an exemplary embodiment, offset isolation and cancellation may be performed during normal operation of the sampling circuitry. In an exemplary embodiment, the present invention combines a front-end switching topology with one or more differential integrator stages and a logic algorithm implemented in the differential integrator stages. In operation, the circuitry preferably performs a number of samples for each stage, applies an inversion factor to the samples in accordance with the algorithm and integrates the samples to effect the cancellation of the offset voltage without substantially affecting the sampled input.

21 Claims, 4 Drawing Sheets

FRACTAL SEQUENCING SCHEMES FOR OFFSET CANCELLATION IN SAMPLED DATA ACQUISITION SYSTEMS

TECHNICAL FIELD OF THE INVENTION

The present invention relates generally to delta-sigma analog-to-digital converters and, more particularly, to enhancing sampled signal quality in sampled-data acquisition systems.

BACKGROUND OF THE INVENTION

Analog-to-digital (A/D) converters are in widespread use today in electronics for consumers, industrial applications, weapons, etc. Typically, A/D converters include circuitry for receiving an analog input signal and outputting a digital value proportional to the analog input signal. This digital output value is typically in the form of either a parallel word or a serial digital bit string. There are many types of A/D conversion schemes such as voltage-to-frequency conversion, charge redistribution, delta modulation, as well as others. Typically, each of these conversion selected has its advantages and disadvantages.

One type of A/D converter that has seen increasing use is that utilizing delta-sigma modulation where an analog voltage is input to a delta-sigma modulator and the output thereof filtered to remove noise. A delta-sigma modulator typically converts an analog input to a digital pulse string having an average amplitude over time proportional to the analog input. Delta-sigma modulation generally provides for high accuracy and wide dynamic range as compared to earlier delta modulation techniques. Delta-sigma modulation is often referred to as an oversampled converter architecture and is typically immune from some of the earlier undesirable second order effects of delta modulation.

There are generally two key components of a delta-sigma A/D converter, an analog modulator and a digital filter. The analog modulator oversamples the analog input and produces a digital output. However, with generally any A/D converter there are a number of noise sources that are inherent to the design. In a typical delta-sigma modulator, there are output stage noise sources and input stage noise sources, the output noise sources normally being dominated by quantization noise and the input noise sources resulting from 1/f noise. In addition, there may also be present thermal noise and a deterministic error from a DC offset that is a static error. The quantization noise at low frequencies is relatively low with the largest portion thereof existing at higher frequencies. This higher frequency portion noise can be filtered out by a digital domain low-pass filter. However, low frequency DC offset and 1/f noise cannot be filtered out by a low-pass filter, and, as such, such effects are typically passed through the filter with the signal information.

SUMMARY OF THE INVENTION

In accordance with teachings of the present invention, an apparatus for isolating and canceling an offset voltage component of a sampled input signal is provided. In an exemplary embodiment, the apparatus preferably includes a front end device operable to receive an input signal and a $M^{th}$ order integrator operably coupled to the front end device including at least one switched feedback capacitor at each stage of the $M^{th}$ order integrator. In addition, the exemplary embodiment may further include control logic operably coupled to the front end device and the $M^{th}$ order integrator. The control logic is preferably operable to command the $M^{th}$ order integrator to integrate the input signal in accordance with an input signal sampling sequence derived from a fractal algorithm such that an offset voltage component of the input signal is substantially canceled upon completion of the input signal sampling sequence.

In a further aspect of teachings of the present invention, a system for canceling an offset component in a sampled signal is provided. In an exemplary embodiment, the system preferably includes an integrator including at least two switched feedback capacitors and control circuitry operably coupled to the integrator and a signal source. The control circuitry is preferably operable to selectively enable a switched feedback capacitor used to integrate a sampled signal in response to a change in signal direction such that a direction of integration of the sampled signal changes with the change in signal direction and an offset voltage present with the sample signal is integrated in the same direction throughout a sampling sequence.

In another aspect of teachings of the present invention, a method for canceling an offset component of sampled input signal in a $M^{th}$ order integrator system is provided. In an exemplary embodiment, the method preferably includes the operations of obtaining a number of input signal samples at each stage of an $M^{th}$ order integrator and applying an inversion factor to the input signal samples in accordance with a fractal sequence offset cancellation algorithm such that each input signal sample conforms to either $V_{in+}=(V_{in}+V_{offset})$ or $V_{in-}=(V_{in}-V_{offset})$. The method preferably further performs the operation of integrating the input signal samples subjected to the inversion factors such that the $V_{offset}$ component of the sampled input signal is cancelled upon completion of the sampling sequence.

In an exemplary embodiment, the present invention provides a technical advantage in its ability to operate independent of many process parameters and its applicability to substantially any sampled-data analog systems without additional requirements.

In an exemplary embodiment, the present invention provides a technical advantage in its ability to cancel signal offset real-time, during normal circuit operation.

In an exemplary embodiment, the present invention provides the technical advantage of diminishing 1/f noise in a sampled-data analog system.

Additional features and advantages of the present invention will be apparent from the following description of the embodiments, given for the purpose of disclosure and taken in conjunction with the accompanying drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Figure 1:
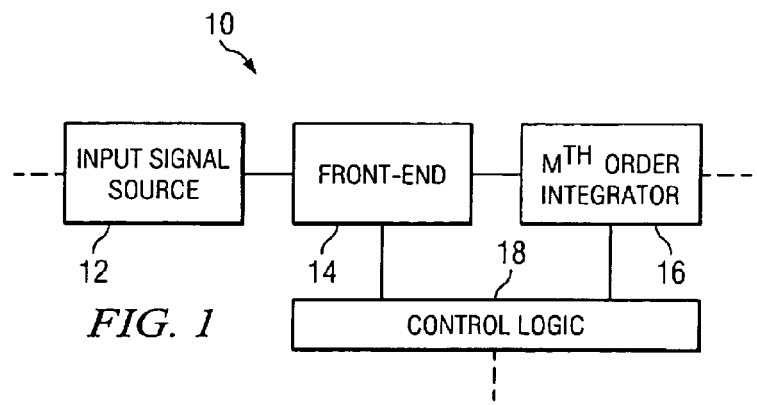
FIG. 1 is a block diagram of an exemplary embodiment of a system for providing on-the-fly cancellation of a $V_{offset}$ component in a sampled input signal according to teachings of the present invention.

While the present invention is susceptible to various modifications and alternative forms, specific exemplary embodiments thereof have been shown by way of example in the drawings and are herein described. It should be understood, however, that the description herein of specific embodiments is not intended to limit the invention to the particular forms disclosed. Instead, the intention of the present disclosure is to cover all modifications, equivalents, and alternatives falling within the spirit and scope of the invention as defined by the appended claims.

DETAILED DESCRIPTION

Preferred embodiments and their advantages are best understood by reference to FIGS. 1 through 5, wherein like numbers are used to indicate like and corresponding parts.

In one aspect, an exemplary embodiment of the present invention is preferably operable to separate an offset component of an input signal and perform special treatment on the offset component to cancel the offset component without interfering with the input signal. Accordingly, in an exemplary embodiment of the present invention, there are preferably two functions performed. In a first respect, an exemplary embodiment of the present invention is operable to isolate the offset component typically present in a sampled input signal. In a second respect, an exemplary embodiment of the present invention is operable to effectively cancel the isolated offset component, leaving a desired, sampled signal for further treatment by device circuitry.

Referring first to FIG. 1, a block diagram illustrating an exemplary embodiment of a system operable to perform on-the-fly cancellation of a $V_{offset}$ component (offset voltage component) typically present in a sampled input signal is shown according to teachings of the present invention. In operation, system 10 of FIG. 1 is preferably operable to isolate a $V_{in}$ (input voltage) and $V_{offset}$ component of a sampled signal and to cancel the $V_{offset}$ component at least before the sampled input signal is passed to additional circuitry for manipulation, interpretation or other utilization.

As illustrated in FIG. 1, an exemplary embodiment of a system operable to perform on-the-fly $V_{offset}$ cancellation 10 preferably includes input signal source 12. Input signal source 12 preferably provides an analog signal for sampling. Input signal source 12 may be a separate component of an electronic device incorporating system 10, a signal source separate and distinct from other components preferably included in system 10 or be otherwise implemented. In addition, the signal produced from input signal source may be in the form of a differential signal, a continuous signal, as well as a signal of other forms or varieties.

Input signal source 12 is preferably coupled to front-end 14 and may be coupled to other components of system 10. Front-end 14 preferably couples input signal source 12 to $M^{th}$ order integrator 16. $M^{th}$ order integrator 16 may also be coupled to other devices included in system 10. Front-end 14 may take a variety of forms. In a preferred embodiment, front-end 14 is adapted and configured to effectively couple to input signal source 14 and to $M^{th}$ order integrator 16. Further, in a preferred embodiment, front-end 14 may be configured to conform to connectivity options available from input signal source 12 and $M^{th}$ order integrator 16. An exemplary embodiment of front-end 14 is described in greater detail below.

Control logic 18 is preferably also included in system 10 and operably coupled to front-end 14 and $M^{th}$ order integrator 16. Control logic 18 may also be coupled to other devices of system 10. Control logic 18 is preferably operable to control front-end 14 and $M^{th}$ order integrator 16 such that a $V_{offset}$ component may be decoupled from a sampled input signal and effectively cancelled. As described in greater detail below, control logic 18 preferably tracks and responds to a signal from input signal source 12 and operates various aspects of front-end 14 and $M^{th}$ order integrator 16 in accordance therewith.

In an exemplary embodiment, the isolation of a $V_{offset}$ component of an input signal in a sampled data analog block is preferably performed by a special analog circuit design discussed in greater detail below with respect to FIGS. 2A and 2B. In operation, an exemplary embodiment of the analog circuit design illustrated in FIGS. 2A and 2B preferably yields a sampled signal of either $V_{in+}=(V_{in}+V_{offset})$ or $V_{in-}=-(-V_{in-}+V_{offset})=(V_{in}-V_{offset})$. In one aspect, one goal of forcing a sampled signal to be as described is to create the possibility to decouple a $V_{offset}$ component from a sampled signal by adding (or subtracting) together these two quantities, $V_{in+}$ and $V_{in-}$, for each sampling period.

Figure 2A:
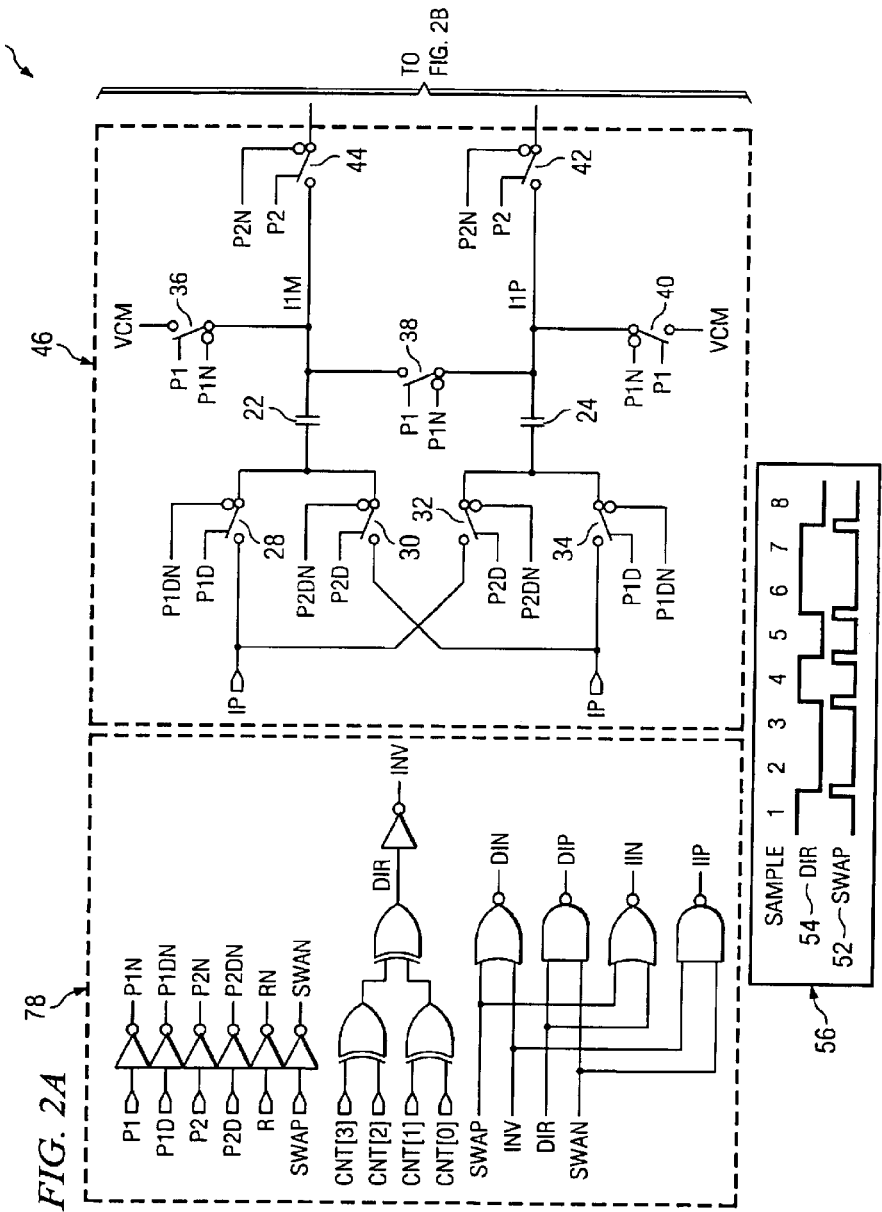
FIGS. 2A and 2B illustrate a circuit diagram depicting an exemplary embodiment of a circuit operable to perform on-the-fly cancellation of a $V_{offset}$ component in a sampled analog input signal according to teachings of the present invention.
Figure 2B:
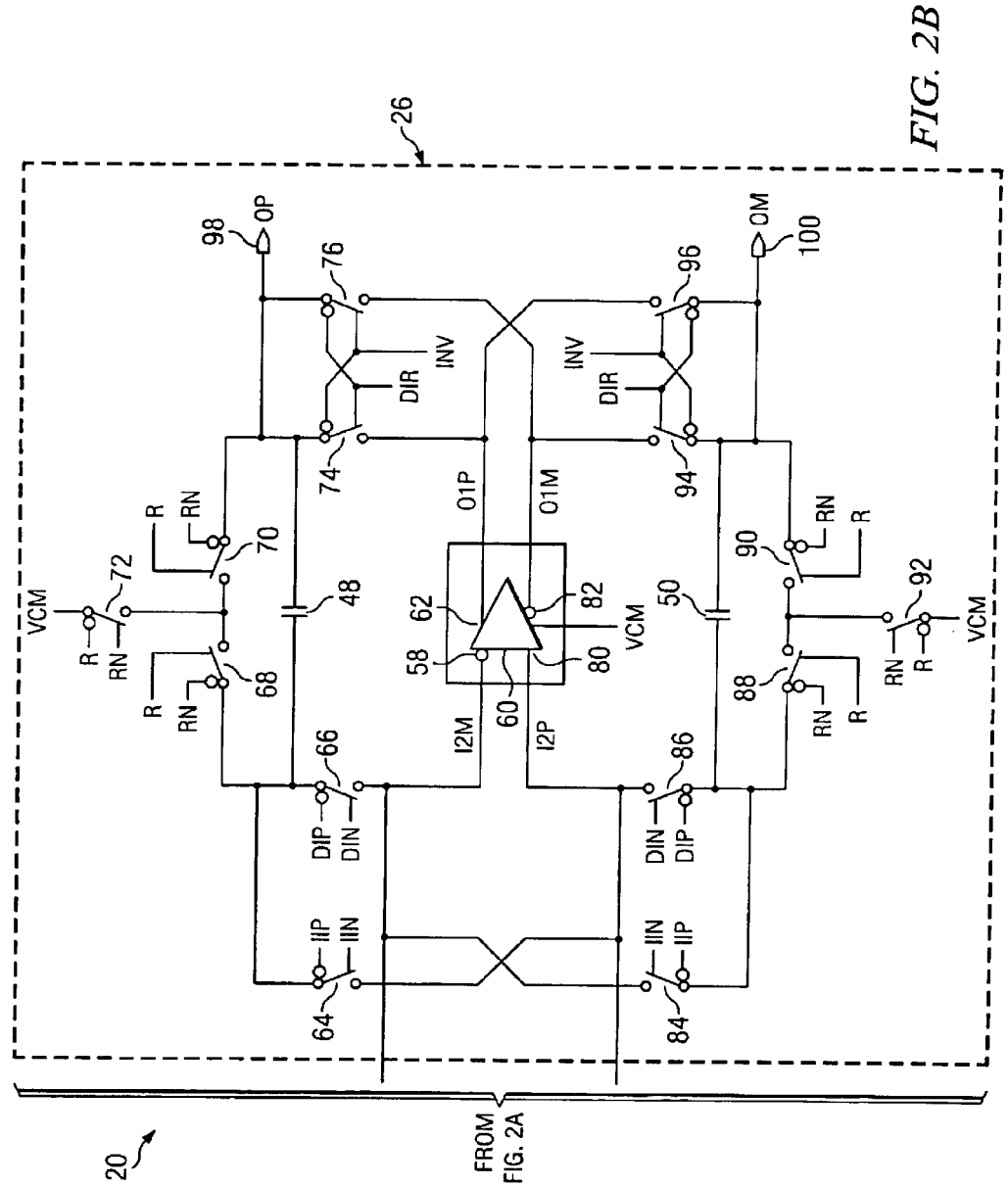

Referring now to FIGS. 2A and 2B, an exemplary embodiment of a circuit topology operable to enable a $V_{offset}$ component of a sampled input signal to be decoupled is shown. It should be noted, however, that other circuit topologies or embodiments operable to decouple a $V_{offset}$ component from a sampled input signal are possible. With the switched capacitance circuitry preferably included in circuit 20 illustrated in FIGS. 2A and 2B, inherent charge injection effects may be observed, however, only differential effects typically need be considered and these effects may be treated as a $V_{offset}$ component subject to cancellation if they are deterministic and reproducible. As illustrated in FIG. 2A and 2B, circuit 20 may be described as a simple-stage differential integrator, however, an exemplary algorithm leveraging circuit 20 does not require differential signals to be efficient.

As implemented in FIGS. 1, 2A and 2B a differential input signal ($V_{in}$=V(IP)–V(IM)) may be charged in phase P1. For example, in phase P1, switched capacitors 22 and 24 may be coupled to V(IP) and V(IM), respectively, and subject to $V_{cm}$, a common mode voltage source included in circuit topology 20. As such, in phase P1, switched capacitors 22 and 24 may be presented with a charge substantially equal to (V(IP)–$V_{cm}$) and (V(IM)–$V_{cm}$), respectively. The charges placed on switched capacitors 22 and 24 in phase P1, which can be simplified to V(IP) and V(IM), respectively, as $V_{CM}$ does not affect the transfer of the signal, may then be passed to integrator 26 in phase P2. In this arrangement, switched capacitors 22 and 24 and switches 28, 30, 32, 34, 36, 38, 40, 42 and 44 may be collectively referred to as front-end topology 46. Circuit front-end topology 46 of FIG. 2A, in the exemplary embodiment, is but one possible implementation of an integrator front-end. As such, according to teachings of the present invention, front-end 46 is independent of an actual implementation, i.e., generally any front-end switching topology is compatible. In the exemplary embodiment illustrated, non-overlapping phases are preferably used to produce smoother transitions, however, it should be noted that other phase timing scenarios may be employed without departing from the spirit and scope of teachings of the present invention.

Preferably coupled to integrator 26 of FIG. 2B is control logic or circuitry 70 operable to switch feedback capacitances 48 and 50 in response to a change in the direction of the input signal. Such a change in input signal direction may be termed an "inversion". When an inversion occurs, SWAP signal 52 preferably enables switched feedback capacitors 48 and 50 preferably included on integrator 26 to be swapped or toggled in order to change the direction in which the sampled signal is integrated while maintaining the direction in which $V_{offset}$ is obtained. By swapping only the direction of the integration of the sampled signal and maintaining the direction in which $V_{offset}$ is obtained, offset may be decoupled from the sampled input signal. Signal DIR 54 is the "direction" in which signals are preferably sampled in order to obtain $V_{in+}$ or $V_{in-}$ for a sampled output signal. The direction of sampling is primarily dependent on the cancellation algorithm used on the system. Timing diagram 56 illustrated in FIG. 2A depicts the timing for DIR signal 54 and SWAP signal 52 according to an exemplary embodiment of a cancellation algorithm incorporating teachings of the present invention. Other arrangements may be implemented in accordance with the teachings disclosed herein.

As illustrated in FIG. 2B, integrator 26 preferably includes switched feedback capacitors 48 and 50. Switched feedback capacitor 48 is preferably coupled to input 58 of op-amp 60 at a first end and to op-amp output 62 at a second end. Switches 64, 66, 68, 70, 72, 74 and 76, at least, preferably cooperate with control logic 78 to charge, enable, disable, discharge, switched feedback capacitor 48 in accordance with the $V_{offset}$ cancellation algorithm implemented. Similarly, switched feedback capacitor 50 is preferably coupled to input 80 of op-amp 60 at a first end and to op-amp output 82 at a second end. Switches 84, 86, 88, 90, 92, 94 and 96, at least, preferably cooperate with control logic 78 to charge, discharge, enable, disable, or otherwise operate switched feedback capacitor 50 in accordance with the $V_{offset}$ cancellation algorithm implemented. As depicted in FIG. 2B, the switches preferably included in integrator 26 may involve certain levels of interdependency and/or cooperation. Outputs 98 and 100 of integrator 26 may be coupled to a subsequent integrator in an $M^{th}$ order integrator system, where M>1, as well as to other components or devices of an electronic apparatus including circuit 20.

A significant aspect of integrator 26 illustrated in FIG. 2B is the amplifier feedback where capacitances configured to decouple $V_{offset}$ from the sampled signal can be swapped or switched. The topology illustrated generally does not add many switches and the control signals for the switches are straightforward to generate and manage. Drawbacks that may be observed in the illustrated topology are charge-injection effects flowing from switches 64, 66, 84 and 86 when switched feedback capacitors 48 and 50 are swapped. Typically, however, only switches at the input of the amplifier need to be considered in calculating value of any charge-injection effects. Further, this charge-injection effect is known to exist in switched-capacitance circuits and can be minimized through proper selection of switch topology.

Having the capability to sample both $V_{in+}$ and $V_{in-}$ in the analog system, an algorithm to effectively cancel $V_{offset}$ is needed. Definition of an algorithm may begin by defining $\epsilon_+=1$ and $\epsilon_-=-1$ and rewriting $V_{in+/-}=V_{in}+\epsilon_{+/-}*V_{offset}$. The value $\epsilon_{+/-}$ may then be defined as the inversion factor for the corresponding sample. In an exemplary embodiment, the $V_{offset}$ cancellation algorithm will preferably switch the inversion factor between +1 and -1 (an inversion) during input signal sampling.

In a first-order integrator system, a simple Voffset cancellation algorithm may be implemented. In such an algorithm, the inversion factor will preferably toggle or swap for every signal sample. If the number of samples N is even, the integrated output data should be substantially equal to N*Vin.

Such a simple algorithm, however, may yield drawbacks. For example, to cancel $V_{offset}$, the number of samples must generally be an even number. In addition, this algorithm will generally only work in a first order integrator which is very limiting. Further sequencing multiple first-order integrators fails to yield favorable results as such a topology tends to produce an output of integrated data at the second order equal to $N(N+1)/2*V_{in}+(N/2)*V_{offset}$ where it can be seen that $V_{offset}$ will not be effectively cancelled.

In accordance with teachings of the present invention, an algorithm based on a fractal sequence of inversion factors defining each sample is provided. In one aspect, the fractal nature of an exemplary $V_{offset}$ cancellation algorithm addresses one of the main limitations of a Chopper algorithm by proposing sampling and inversion sequences that can be adapted to every order of integration in the system. The properties of those sequences generally include concatenation, i.e., we can concatenate sequences and still cancel $V_{offset}$ sign does not matter, i.e., the same result can be obtained in an inverted sequence order increases complexity and $V_{offset}$ will not be cancelled at every sample, but at the end of a sampling sequence.

The minimum size of the sequence, i.e., the minimum number of samples, can be shown mathematically to depend on the order of the system and is equal to $2^M$ where M represents the order of the analog system. It can also be shown that, except for the sign of the sequence, there is substantial uniqueness in the minimal sequence. In an exemplary embodiment, the minimal sequence may be defined as:

$$\epsilon[k, M] := (-1)^{\sum_{j=0}^{M-1} Mod\ [IntegerPart\ [2^{-j}k], 2]} \qquad \text{Eq. 1}$$

where $\epsilon[k,M]$ is the $k^{th}$ sample inversion factor for a $M^{th}$ order system. With a sequence of inversion factors as defined by Eq. (1), $V_{offset}$ may be cancelled at the end of the $2^M$-th sample, assuming the function that represents the influence of $V_{offset}$ on $V_{out}$ has a value substantially equal to zero.

While Eq. 1 appears complex, the sequence is considerably straightforward. For example, in a first order system, the sequence is (+1) and then (-1) which may be represented as: (+-). In some respects, the first order system substantially approximates the Chopper algorithm and this fractal sequence may be defined as a generalization of the Chopper algorithm. Deriving from that discussed above, the fractal rule obtained from this algorithm may be written as:

Sequence($M$+1)=(sequence($M$) inverted sequence($M$))      Eq. 2

Utilizing Eq. 2 in a second order system example, the fractal rule of the first order system may be applied which leads to ((+-)(-+)) in which (+-) is the first order sequence detailed above. In a third order example, application of the above defined rule yields a fractal sequence of ((+--+)(-++-)). With the fractal nature of these sequences, the present invention can be implemented for every order of integration, which means for every amplifier. In this configuration, $V_{offset}$ from every integrator in the system may be cancelled if we are looking at a very precise system or a system where front-end gain is insignificant. As such, teachings of the present invention provide a substantial advantage when a system has many stages with low gain on each stage tending to induce larger input $V_{offset}$. As mentioned above, the topology of the present invention may add differential charge injection at each stage but the effects of such charge injection may be minimized with proper switching circuitry selection.

Included in the fractal sequencing taught by the present invention are many advantages. For an $M^{th}$ order system, $V_{offset}$ is substantially cancelled at the output of every order of the chain. The repeatability of the fractal sequencing of the present invention may also act as an auto-zeroing scheme and contribute to 1/f noise reduction. Further, any number of samples desired for a sequence may be had within the same inversion factor. For example, for a second order sequence with three samples at each stage, the sequence ((+++)(---)(---)(+++)) may be used to cancel $V_{offset}$. In one aspect, such sequencing may reduce second order charge injection effects due to less frequent inversion, however, losses in 1/f reduction may be affected by implementing too many samples without inversions. There is some minor limitation to the number of samples that has to be a multiple of $2^M$, but this is very often the case in sampled-data analog systems. Derivatives of these sequences may also be identified to adapt a sequence to any even number of samples and more than $2^M$. $V_{offset}$ may be cancelled at every output of the chain by implementing this minimal sequence, however, a multiple of $2^M$ samples will likely be required. In such a case, consideration of the minimal sequence in priority compared to the derivatives that would cancel $V_{offset}$ at the output, but not necessarily at every output of the chain is suggested, e.g., the second order sequence ((+-+)(---)), will not cancel $V_{offset}$ at the output of the first stage, but the second.

The present invention may be adapted for operation implemented in a continuous system, however, with alternate circuitry. Despite requiring an alternate circuit topology, the sequences and mathematical theory described above will apply in a continuous time system and continuous fractal functions operable to effectively cancel $V_{offset}$ may be derived. In a continuous time system, such as a continuous delta-sigma modulator, the limitation regarding the number of samples required to effectively cancel $V_{offset}$ are removed. The sequence inversion factors in a continuous time system may be implemented as a digital bit stream which may be derived from a counter followed by XOR gates as illustrated in Control logic 78 of FIG. 2A. Such an implementation may be directly implemented and is substantially cost effective.

Figure 3:
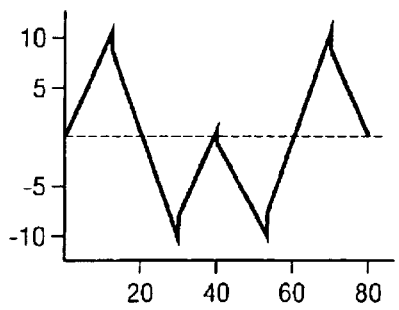
FIGS. 3 through 8 illustrate graphs depicting simulated output from an exemplary embodiment of the present invention at each stage of a third order integrator according to teachings of the present invention.
Figure 4:
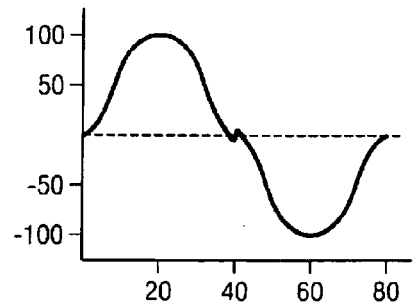
Figure 5:
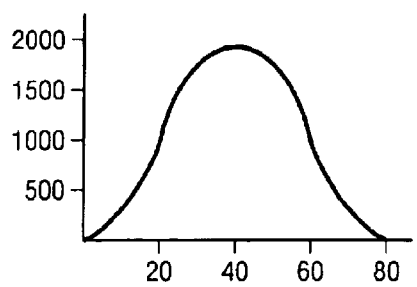
Figure 6:
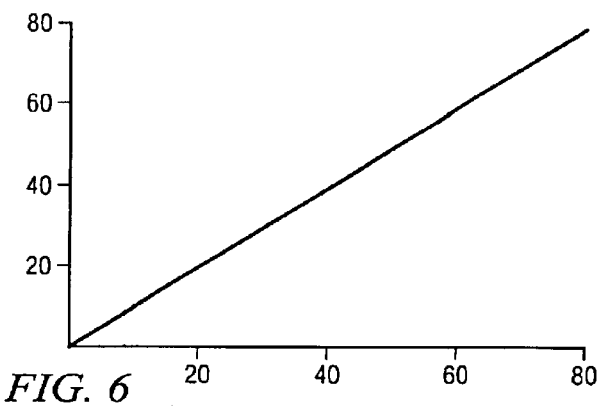
Figure 7:
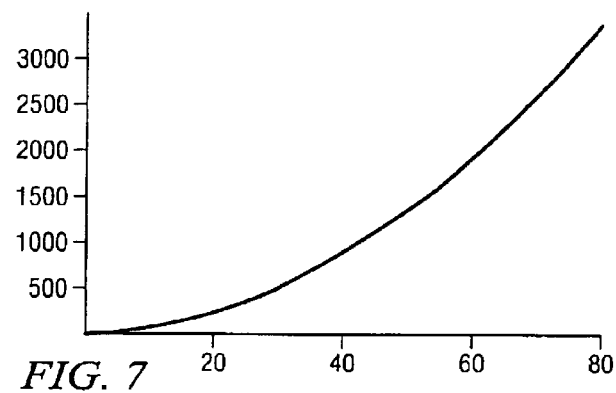
Figure 8:
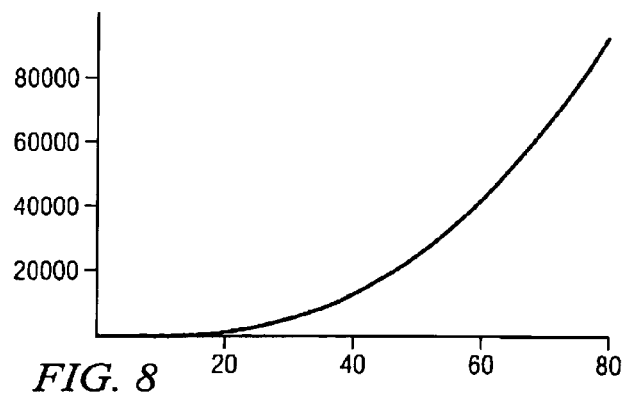

Referring now to FIGS. 3–8, graphs showing the output at each stage of simulated a $3^{rd}$ order system are shown according to teachings of the present invention. The y-axis of FIGS. 3, 4 and 5 represent the amount of $V_{offset}$ which is integrated at the output of each stage. The x-axis represents the number of sample. The slight discontinuity associated with the first stage in FIG. 3, approximately two-times $V_{offset}$ may be attributed to the inversion topology and generally does not disturb offset cancellation. The y-axis and x-axis of FIGS. 6, 7 and 8 represent $V_{signal}$ and the number of sample, respectively.

FIGS. 3, 4 and 5 illustrate plots of $V_{offset}$ from the first, second and third stages of a $3^{rd}$ order integrator, respectively, in a modulator loop simulated by Mathematica with a third order sequence and ten (10) samples per packet defined by the same inversion factor. Similarly, FIGS. 6, 7 and 8 illustrate plots of $V_{signal}$ from the first, second and third stage of a $3^{rd}$ order integrator, respectively. Comparing FIGS. 3, 4 and 5 to FIGS. 6, 7 and 8, respectively, the integration of $V_{signal}$ and the corresponding disintegration or cancellation of $V_{offset}$ resulting from teachings of the present invention can be seen.

In summary, the present invention provides many of the advantages of the Chopper algorithm while creating the ability to employ the teachings herein in systems of any order, including continuous time systems. In an exemplary embodiment, implementation of the present invention comes with almost no increase in component size and a simple structure, one counter, some switches and gates in one implementation. In addition, the present invention enables "on-the-fly" offset cancellation, ridding users of the need to perform time consuming offset calibrations. As such, value may be added to systems where offset calibrations are needed, especially systems where calibrations require the expenditure of substantial amounts of time. Further, teachings of the present invention provide a flexible algorithm, reductions in 1/f noise and few second-order effects except those well known charge injection effects inherent to switched-capacitance systems.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention may be capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An apparatus for isolating and canceling an offset voltage component of a sampled input signal, comprising:
    a front end device operable to receive an input signal;
    a $M^{th}$ order integrator operably coupled to the front end device, the integrator including at least one switched feedback capacitor at each stage of the $M^{th}$ order integrator; and
    control logic operably coupled to the front end device and the $M^{th}$ order integrator, the control logic operable to command the $M^{th}$ order integrator to integrate the input signal in accordance with an input signal sampling sequence derived from a fractal algorithm such that an offset voltage component of the input signal is substantially canceled upon completion of the input signal sampling sequence.

2. The apparatus of claim 1, further comprising the control logic operable to implement a sampling sequence in the $M^{th}$ order integrator substantially approximating an inversion sequence of sequence(M+1)=(sequence(M) inverted sequence(M)), where an inversion sequence for (M=1) is (+1−1).

3. The apparatus of claim 1, further comprising the control logic operable to effect a sampling sequence in the $M^{th}$ order integrator including at least $2^M$ samples, where M is the order of the integrator.

4. The apparatus of claim 1, further comprising each integrator stage of the Mth order integrator having an operational amplifier, the operational amplifier including a first switched feedback capacitor coupled between a first input and an output thereof and a second switched feedback capacitor coupled between a second input and the output thereof.

5. The apparatus of claim 1, further comprising:
    an $M^{th}$ order differential integrator operably coupled to the front-end; and
    a differential input signal source operably coupled to the front-end and operable to provide a differential input signal to the $M^{th}$ order differential integrator for sampling.

6. The apparatus of claim 1, further comprising the control logic operable to selectively swap one or more switched feedback capacitors in response to a direction change of the input signal.

7. The apparatus of claim 1, further comprising a delta-sigma modulator operably coupled to the $M^{th}$ order integrator, the delta-sigma modulator operable to receive a substantially continuous input signal.

8. A system for canceling an offset component in a sampled signal, comprising:
    an integrator including at least two switched feedback capacitors; and
    control circuitry operably coupled to the integrator and a signal source providing a signal to be sampled in the integrator, the control circuitry operable to selectively enable a switched feedback capacitor used to integrate the sampled signal in response to a change in signal direction such that a direction of integration of the sampled signal changes with the change in signal direction and an offset voltage present with the sample signal is integrated in the same direction throughout a sampling sequence.

9. The system of claim 8, further comprising the control circuitry operable to implement an input signal sampling inversion sequence substantially equal to sequence(M+1)= (sequence(M) inverted sequence(M)).

10. The system of claim 9, wherein an inversion sequence for (M=1)=is (+1−1).

11. The system of claim 10, further comprising further comprising the system operable to sample the signal from the signal source in accordance with a minimum sequence of at least $2^M$ samples, where M is the order of the system.

12. The system of claim 8, further comprising an $M^{th}$ order integrator where M>1.

13. The system of claim 12, further comprising an $M^{th}$ order integrator where M=three.

14. The system of claim 8, further comprising further comprising a front-end operably coupling the integrator to the signal source.

15. The system of claim 14, further comprising the front-end including a delta-sigma modulator.

16. The system of claim 8, further comprising the integrator including at least one op-amp and a switched feedback capacitor operably coupled between a first input terminal of each op-amp and an op-amp output and a switched feedback capacitor operably coupled between a second input terminal of each op-amp and the op-amp output.

17. A method for canceling an offset component of sampled input signal in a $M^{th}$ order integrator system, comprising:
    obtaining a number of input signal samples at each stage of an $M^{th}$ order integrator;
    applying an inversion factor to the input signal samples in accordance with a fractal sequence offset cancellation algorithm such that each input signal sample conforms to either $V_{in+}=(V_{in}+V_{offset})$ or $V_{in-}=(V_{in}-V_{offset})$; and
    integrating the input signal samples subjected to the inversion factors such that the $V_{offset}$ component of the sampled input signal is cancelled upon completion of the sampling sequence.

18. The method of claim 17, further comprising obtaining at least $2^M$ input signal samples, where M is the order of the system.

19. The method of claim 17, further comprising generating the inversion factors applicable to the sampled input signals based on $$\varepsilon[k, M] := (-1)^{\sum_{j=0}^{M-1} Mod\,[IntegerPart\,[2^{-j}k],2]}$$

where $\epsilon[k,M]$ is the $k^{th}$ sample inversion factor for a $M^{th}$ order system.

20. The method of claim 19, further comprising implementing a fractal sequence rule of inversion factors substantially in accordance with sequence(M+1)=(sequence(M) inverted sequence(M)), where an inversion sequence for (M=1)is (+1−1).

21. The method of claim 17, further comprising applying the inversion factors of the fractal sequence offset cancellation algorithm to a substantially continuous input signal.

* * * * *